Figure 1:
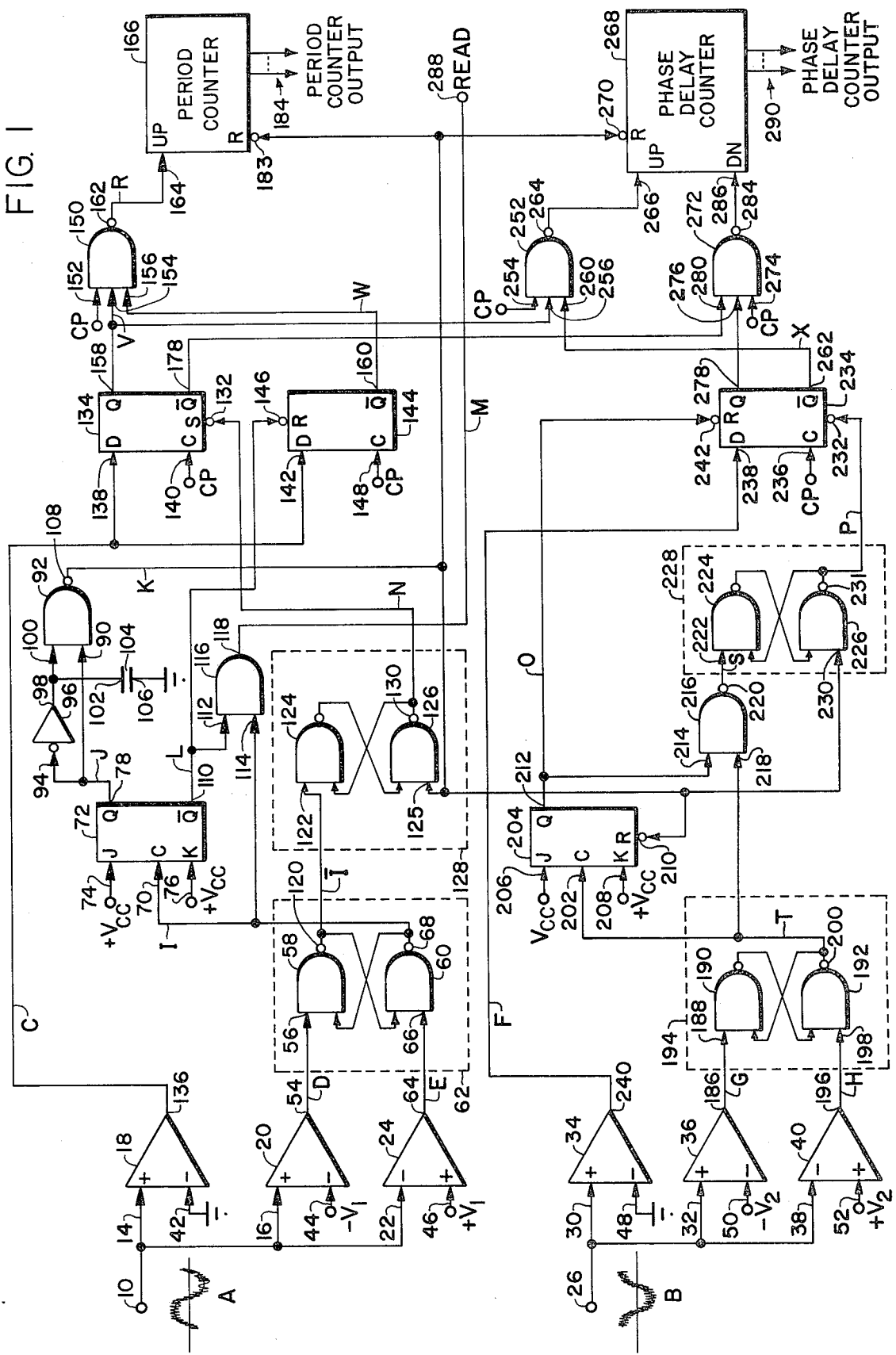

United States Patent [19]

Moore

[11] 3,953,794
[45] Apr. 27, 1976

[54] DIGITAL PHASE DETECTOR
[75] Inventor: Phillip M. Moore, Phoenix, Ariz.
[73] Assignee: Motorola Inc., Chicago, Ill.
[22] Filed: Mar. 27, 1975
[21] Appl. No.: 562,694

[52] U.S. Cl.............................. 324/83 D; 328/133
[51] Int. Cl.².......................................... G01R 25/00
[58] Field of Search...................... 324/83 D, 140 D; 328/133

[56] References Cited
UNITED STATES PATENTS

| | | | |
|---|---|---|---|
| 3,375,522 | 3/1968 | Kennedy............................ | 324/83 D |
| 3,381,220 | 4/1968 | Burr.................................. | 324/83 D |
| 3,820,022 | 6/1974 | Watt.................................. | 324/83 D |
| 3,889,186 | 6/1975 | Larson............................... | 324/83 D |

Primary Examiner—R. V. Rolinec
Assistant Examiner—Michael J. Tokar
Attorney, Agent, or Firm—M. David Shapiro; Sang Ki Lee; Harry M. Weiss

[57] ABSTRACT

A digital system for measuring a phase relationship between two noisy signals of a given period wherein the phase difference measurement may lie in the range of from 0 to 360 degrees. The noisy signals are amplified and limited so that the processed signal only contains noise in the time vicinity around the zero crossing points. Time interval counters are utilized to measure the time delay between signals and the time period of the reference signal. Phase relationship may be determined by multiplying the ratio of the two digital numbers produced by 360°. Errors in digital outputs are minimized by digitally integrating the counter input during the noisy zero crossover periods. The measurements are completed within two period times of the signals being measured and may be repeated in each of the succeeding two period times.

7 Claims, 3 Drawing Figures

DIGITAL PHASE DETECTOR

GOVERMENT CONTRACT

The invention herein described was partially developed in the course of or under a contract, or subcontract thereunder, with the Air Force Armament Laboratory, Eglin Air Force Base, Florida.

FIELD OF THE INVENTION

This invention relates to a system for measuring a phase relationship between two noisy signals and, in particular, to a system for digitally minimizing noise errors and for presentation of the phase relationship as a ratio between two digital numbers.

BACKGROUND OF THE INVENTION

In prior art systems for measuring phase relationship between two noisy signals, it is well established that there are three basic problems: (1) The presence of noise introduces errors in the measurement, (2) analog techniques are relatively slow in producing useful measurements, usually requiring the measurement to be made over many periods of the signals being measured and (3) prior art systems are frequently not capable of measuring phase differences over the full range of from 0° to 360°.

Serious attempts to solve some of these problems have compounded others of them. Digital design approaches to these problems have been used but they have not solved all three problems listed above and they have tended toward high parts count, expense and volume in the circuits utilized.

SUMMARY OF THE INVENTION

The foregoing and other shortcomings and problems of the prior art are overcome, in accordance with the present invention, by utilizing digital means for integrating the noise in the time period of the crossover points and presenting the measured phase angle within two period times of the measured signals as a ratio of two digital numbers from two integrated circuit digital counters.

According to one aspect of the present invention, the signals presented for measurement are amplified and limited to restrict the noise to the time vicinity of the zero crossing points of the input.

According to another aspect of the present invention, the noise in the vicinity of the zero crossing points is digitally integrated to minimize the measurement error introduced by the noise.

DESCRIPTION OF THE INVENTION

The foregoing and other aspects of the present invention will be understood more fully from the following detailed description of an illustrative embodiment of the present invention in conjunction with accompanying drawings, in which:

FIG. 1 is a block logic diagram of the preferred embodiment of the invention.

FI. 2 presents waveforms generated in the operation of the system as shown in FIG. 1.

Figure 2:
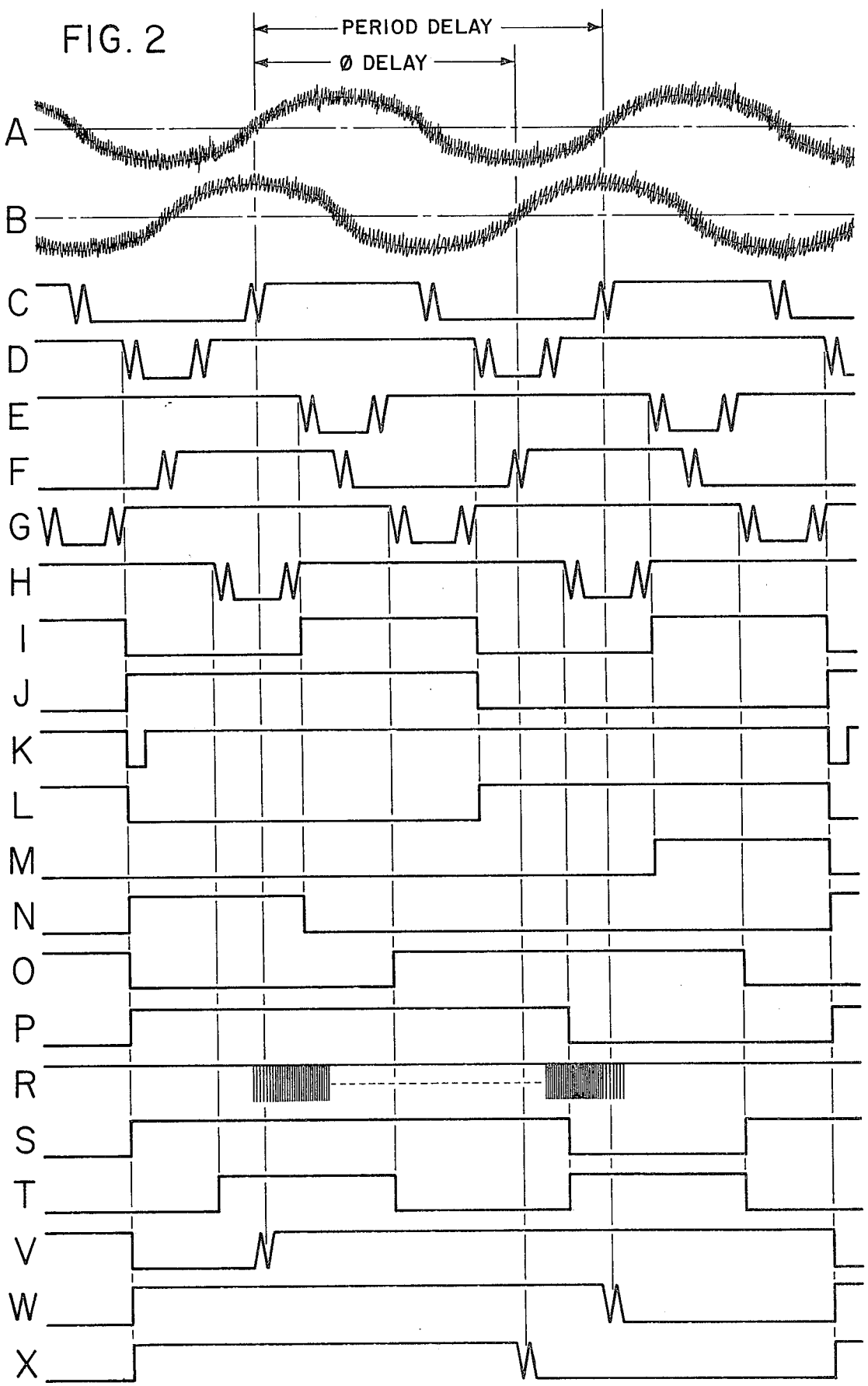
Figure 3:
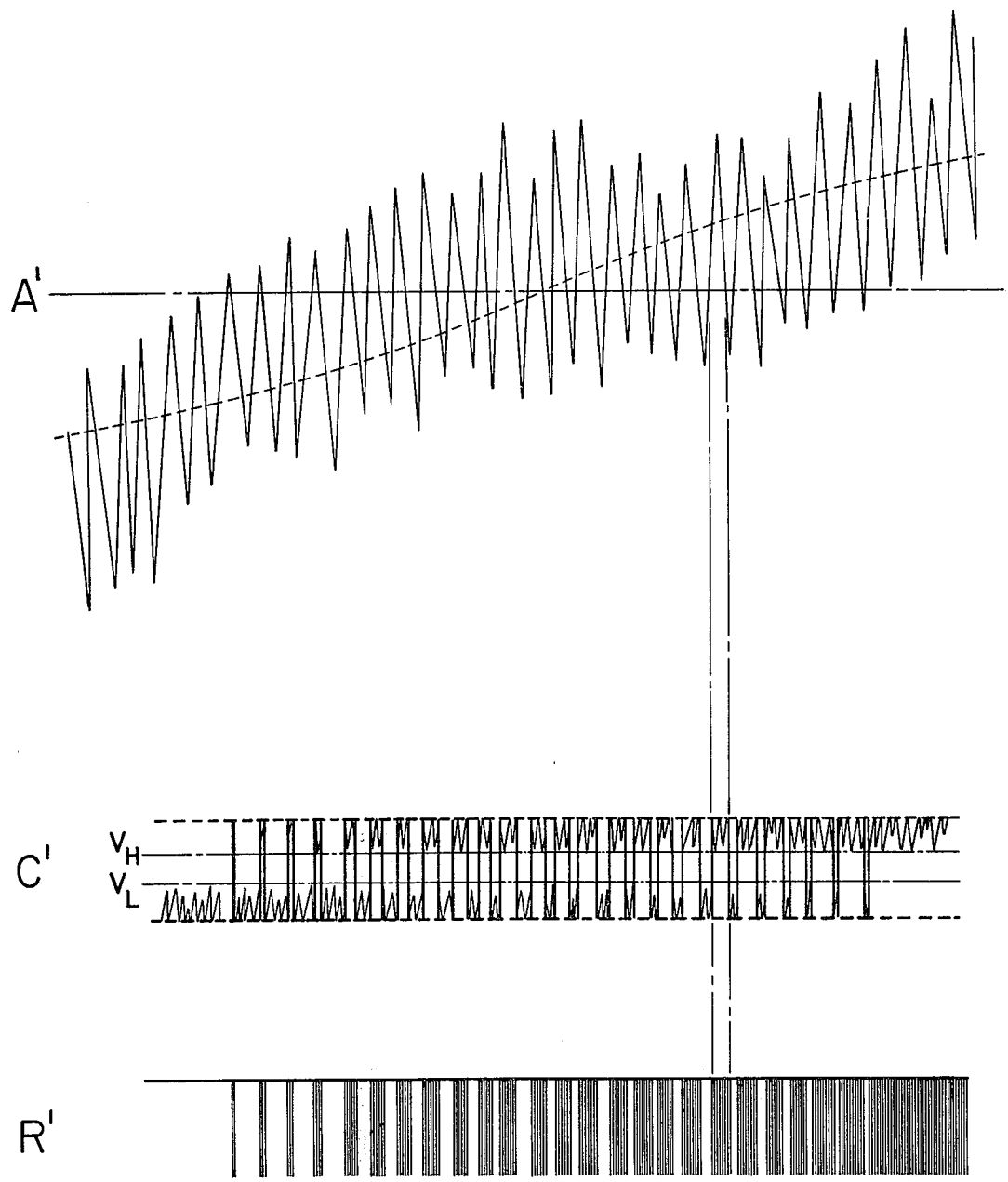

FIG. 3 shows details of some of the waveforms generated in the operation of the system as shown in FIG. 2.

The interconnections of the logic block diagram of FIG. 1 are described as follows:

Referring to FIG. 1, a reference noisy sinusoidal signal A is applied at input terminal 10 to reference signal differential amplifiers 18, 20, 24 which serve as threshold detectors. Input terminal 10 is connected to the positive input terminals 14, 16 of differential amplifiers 18, 20, respectively, and to negative input terminal 22 of differential amplifier 24.

Similarly, a noisy sinusoidal signal B of unknown phase is applied at input terminal 26 to unknown signal differential amplifiers 34, 36, 40 which also serve as threshold detectors. The phase relationship between signal A and signal B is unknown and it is the purpose of the present invention to measure this unknown phase relationship. Input terminal 26 is connected to the positive input terminals 30, 32 of differential amplifiers 34, 36, respectively, and to negative input terminal 38 of differential amplifier 40.

One skilled in the art will recognize, as he more clearly understands the present invention, that the noisy input signals are not limited to sinusoids. Any periodic signal that is symmetrical about a vertical axis drawn through either a high or low peak is suitable as long as the zero crossing segments have a finite slope.

Negative input signal terminal 42 of differential amplifier 18 is connected to ground or common voltage reference point. Negative input signal terminal 44 of differential amplifier 20 is connected to negative bias voltage source $-V_1$. Positive input signal terminal 46 of differential amplifier 24 is connected to positive bias voltage source $+V_1$.

Similarly, negative input signal terminal 48 of differential amplifier 34 is connected to the ground or common reference point. Negative input signal terminal 50 of differential amplifier 36 is connected to negative bias voltage source $-V_2$. Positive input signal terminal 52 of differential amplifier 40 is connected to positive bias voltage source $+V_2$.

Output signal terminal 54 of differential amaplifier 20 is connected to input signal terminal 56 of NAND gate 58. NAND gate 58 and NAND gate 60 are interconnected to form DC flip-flop 62. Output signal terminal 64 of differential amplifier 24 is connected to input signal terminal 66 of NAND gate 60, part of DC flip-flop 62. Output signal terminal 68 of NAND gate 60, part of DC flip-flop 62, is connected to the clock input terminal 70 of J-K flip-flop 72.

The J and K input terminals 74, 76 of J-K flip-flop 72 are connected to high logic level voltage $+V_{CC}$. Q output terminal 78 of J-K flip-flop 72 is connected to input signal terminal 90 of NAND gate 92 and to input signal terminal 94 of inverting amplifier 96. Output signal terminal 98 of inventing amplifier 96 is connected to input signal terminal 100 of NAND gate 92 and to one terminal 102 of capacitor 104. The other terminal 106 of capacitor 104 is connected to ground reference voltage. Connections to output terminal 108 of NAND gate 92 will be referenced presently.

$\overline{Q}$ output terminal 110 of J-K flip-flop 72 and output signal terminal 68 of NAND gate 60, part of DC flip-flop 62, are connected respectively to input terminals 112, 114 of AND gate 116.

Output signal terminal 118 of AND gate 116 provides READ signal "M" of FIG. 2 and will be discussed further.

Output signal terminal 120 of NAND gate 58, part of DC flip-flop 62, is connected to input terminal 122 of NAND gate 124. Output terminal 108 of NAND gate 92 is connected to input terminal 125 of NAND gate 126. NAND gate 124 and NAND gate 126 are interconnected to form DC flip-flop 128. Output signal terminal 130 of NAND gate 126, part of DC flip-flop 128, is connected to SET input terminal 132 of "D" flip-flop 134.

Output signal terminal 136 of differential amplifier 18 is connected to DELAY input terminal 138 of "D" flip-flop 134. CLOCK input terminal 140 of "D" flip-flop 134 is connected to clock pulse source CP. Output terminal 136 of differential amplifier 18 is also connected to DELAY input signal terminal 142 of "D" flip-flop 144. $\bar{Q}$ output signal terminal 110 of J-K flip-flop 72 is connected to RESET input terminal 146 of "D" flip-flop 144. CLOCK input terminal 148 of "D" flip-flop 144 is connected to clock pulse source CP.

NAND gate 150 has three input terminals 152, 154, 156. Input terminal 152 is connected to clock pulse source CP. Input terminal 154 is connected to Q output terminal 158 of "D" flip-flop 134. Input terminal 156 is connected to $\bar{Q}$ output terminal 160 of "D" flip-flop 144.

Output signal terminal 162 of NAND gate 150 is connected to UP count control input terminal 164 of Period Counter 166.

RESET input terminal 183 of Period Counter 166 is connected to output terminal 108 of NAND gate 92.

Period Counter 166 has digital output terminals 184 available for connection to auxiliary equipment, not shown.

Output signal terminal 186 of differential amplifier 36 is connected to input signal terminal 188 of NAND gate 190. NAND gate 190 and NAND gate 192 are interconnected to form DC flip-flop 194. Output signal terminal 196 of differential amplifier 40 is connected to input signal terminal 198 of NAND gate 192, part of DC flip-flop 194.

Output signal terminal 200 of NAND gate 192, part of DC flip-flop is connected to CLOCK input terminal 202 of J-K flip-flop 204. J and K input terminals 206, 208 of J-K flip-flop 204 are connected respectively to high logic level voltage source $+V_{CC}$. RESET input terminal 210 of J-K flip-flop 204 is connected to output terminal 108 of NAND gate 92. Q output terminal 212 of J-K flip-flop 204 is connected to input terminal 214 of NAND gate 216. Another input terminal 218 of NAND gate 216 is connected to output terminal 200 of NAND gate 192, part of DC flip-flop 194.

Output terminal 220 of NAND gate 216 is connected to input terminal 222 of NAND gate 224. NAND gate 224 and NAND gate 226 are interconnected to form DC flip-flop 228. Input terminal 230 of NAND gate 226, part of DC flip-flop 228 is connected to output terminal 108 of NAND gate 92.

Output terminal 231 of NAND gate 226, part of DC flip-flop 228, is connected to SET input terminal 232 of "D" flip-flop 234. CLOCK input terminal 236 of "D" flip-flop 234 is connected to clock pulse source CP. DELAY input terminal 238 of "D" flip-flop 234 is connected to output signal terminal 240 of differential amplifier 34. RESET input terminal 242 of "D" flip-flop 234 is connected to Q output terminal 212 of J-K flip-flop 204.

NAND gate 252 has three input terminals 254, 256, 260. Input terminal 254 is connected to clock pulse source CP. Input terminal 256 is connected to Q output terminal 158 of "D" flip-flop 134. Input terminal 260 is connected to $\bar{Q}$ output terminal 262 of flip-flop 234.

Output terminal 264 of NAND gate 252 is connected to UP count control terminal 266 of Phase Delay Counter 268. RESET input terminal 270 of Phase Delay Counter 268 is connected to output terminal 108 of NAND gate 92.

NAND gate 272 has three input terminals 274, 276, 280. Input terminal 274 is connected to clock pulse source CP. Input terminal 276 is connected to Q output terminal 278 of "D" flip-flop 234. Input terminal 280 is connected to $\bar{Q}$ output terminal 178 of "D" flip-flop 134.

Output terminal 284 of NAND gate 272 is connected to DN count control terminal 286 of Phase Delay Counter 268.

Output terminals 290 of Phase Delay Counter 268 are available for connection to auxiliary equipment, not shown.

The foregoing completes the interconnection description of the preferred embodiment of the invention. It will be obvious to one skilled in the art, as he studies the functional operation description that follows, that there will be other connection configurations which may be used to gain the same or similar functional results.

The system of the present invention is designed to accept noisy sinusoidal input signals of a given period and to accurately measure the phase displacement of a noisy signal of unknown phase displacement with respect to a noisy reference signal.

In the following description, references to signal (letter) will be understood to refer to the letter designated connections of FIG. 1 and to the letter referenced waveforms of FIGS. 2 and 3. Further references to the Figure numbers will be omitted for clarity.

The zero crossing portions of signals C through H, V, W and X of FIG. 2 are shown as an idealized "N" shape. Actually, these portions of these signals are noisy and the "N" shaped configuration is shown for convenience only.

FIG. 3 illustrates an expanded portion of FIG. 2 showing the detail of a zero crossing portion of signal A as at A', of signal C as at C' and of signal R as at R'.

Signal A, is a typical representation of a phase reference signal. It is applied to input terminal 10 of differential amplifier 12. As has been previously described, input terminal 10 is connected to each of the input terminals 14, 16 and 22 of differential amplifiers 18, 20 and 24 respectively. Differential amplifiers 18, 20 and 24 are identical high gain, amplitude limiting, biased amplifiers. While the input signal is connected to terminal 14 of differential amplifier 18, the other input terminal 42 is connected to signal ground. Since input reference signal A varies symetrically above and below this signal ground, the positive and negative portions of signal A are amplified and limited symetrically in differential amplifier 18 and the output signal C that appears at output terminal 136 is a symetrical square wave. Since signal A is amplitude limited in differential amplifier 18, no noise appears on the positive and negative amplitude limited levels of signal C, but at the time corresponding to the zero crossing time of signal A, signal C demonstrates a presence of noise. The time base width of this noise is a function of the amplitude of the noise on signal A with respect to the amplitude of the sine wave portion of signal A, as will be well understood by one skilled in the art.

Because the invention as described depends upon the noise of signal C being distributed randomly, timewise, around the corresponding zero crossing time of signal A, and since differential amplifier 18 has a small offset voltage, that is; the positive and negative input level excursions of signal A will not normally be amplified by precisely the same amount; differential amplifier 18 is equipped with a manually adjusted offset voltage control (not shown) for the purpose of adjusting symmetry of amplification and to provide correction for measurement errors, to be explained subsequently. Differential amplifier 34 is similarly equipped with manually adjustable offset voltage control (not shown) for the same purpose.

It should be noted that while input signal A is also fed to input terminals 16 and 22 of identical differential amplifiers 20 and 24, respectively, these amplifiers operate somewhat differently from differential amplifier 18, just described. Input terminal 16 of differential amplifier 20 is the positive polarity input terminal. The negative polarity input at terminal 44 is connected to $-V_1$, an adjustable source of bias voltage. Proper adjustment and setting of this voltage provides an output signal on terminal 54 of differential amplifier 20 which has the characteristics of signal D. The presence of noise in signal D is not relevant to its use in the invention, but the reader will note that the negative going portions of signal D are located within the corresponding time of the negative portion of signal C. This fact will be utilized in the further explanation of the invention.

Signal A is likewise applied to input terminal 22 of differential amplifier 24, the negative polarity input terminal of this amplifier. The positive polarity input terminal 46 of differential amplifier 24 is connected to a variable bias voltage source $+V_1$. Proper adjustment and setting of this voltage provides an output signal on output terminal 64 of differential amplifier 24 which has the characteristics of signal E. The presence of noise in signal E is not relevant to its use in the invention, but the reader will note that the negative going portions of signal E are located within the corresponding time of the positive portion of signal C. This fact will be utilized in the further explanation of the invention.

NAND gates 58 and 60 are interconnected to form DC flip-flop 62. Input terminals 56 and 66 are fed from output terminal 54 (signal D), of differential amplifier 20 and output terminal 64 (signal E) of differential amplifier 24, respectively. Flip-flop 62 responds to the negative (or low) portion of signal D to provide a high logic level output at output terminal 120 and a low logic level output at output terminal 68. Conversely, flip-flop 62 responds to the negative (or low) portion of signal E to provide a high logic level output at output terminal 68 and a low logic level output at output terminal 120.

It will be understood, then, that output signal I, will appear at output terminal 68 of flip-flop 62 and the complement of signal I ($\bar{I}$ not shown in FIG. 2) will appear at output terminal 120 of flip-flop 62. Signal I is applied to J-K flip-flop 72 at CLOCK input terminal 70. The J and K terminals 74, 76 are connected to high logic voltage level $+V_{CC}$. As will be well understood by those skilled in the art, J-K flip-flop 72 will respond to signal I input by changing its output state on each succeeding transitiion of input signal I from a high to a low input logic level.

Signal J will therefore be generated at the Q output terminal 78 of J-K flip-flop 72. It will be apparent then, that the complement of signal J, signal L, will be generated at $\bar{Q}$ terminal 110 of J-K flip-flop 72.

Inverting amplifier 96, capacitor 104 and NAND gate 92 are interconnected to provide signal K at output terminal 108 of NAND gate 92 in response to input signal J from Q output terminal 78 of J-K flip-flop 72. Capacitor 104 serves to delay the output signal from terminal 98 of inverting amplifier 96 so that during the time of the delay, both signals to input terminals 90 and 100 of NAND gate 92 are of high logic level for a short period of time causing a corresponding low level pulse, signal K to be generated at output terminal 108 of NAND gate 92.

NAND gates 124 and 126 are interconnected to form DC flip-flop 128. The complement (not shown) signal $\bar{I}$ of signal I, is fed from output terminal 120 of DC flip-flop 62 to input terminal 122 of DC flip-flop 128. Signal K is fed from output 108 of NAND gate 92 to input terminal 125 of DC flip-flop 128. When signal $\bar{I}$ (not shown) on input terminal 122 of DC flip-flop 128 goes to a low logic level, output terminal 130 goes to a low logic level. When signal K on input terminal 125 of DC flip-flop 128 goes to a low logic level, output terminal 130 goes to a high logic level. The net result of the $\bar{I}$ and K signal input to DC flip-flop 128 is an output on terminal 130 as illustrated by signal N.

Signal N is fed to SET input terminal 132 of "D" flip-flop 134. This input terminal 132 has the capability of holding Q output terminal 158 high whenever it is in the low logic state. When, on the other hand, SET input terminal 132 is in a high logic level state, the "D" flip-flop 134 is free to respond to signal C on DELAY input terminal 138 and to CP (clock pulse) inputs on CLOCK terminal 140.

In the presence of a high logic level input at SET input terminal 132, "D" flip-flop 134 will change Q output terminal 158 state to correspond to that of DELAY input terminal 138 at the time of the next CP pulse on CLOCK terminal 140.

CP pulse is generated within the circuits of the invention but the generator is not shown in the interest of clarity. The pulse width and frequency of CP may be of any value depending on the frequency of the incoming noisy signals, A and B. In general, the frequency selected for CP will be at least an order of magnitude higher than that of sine wave signals A and B but, in any case, will be selected according to the accuracy of measurement required in a particular measurement system. The frequency of CP will determine the digital error in the measurement system, as will be seen subsequently. For example, if CP is selected to be 10 MHz, the digital count will be based on a 0.1 microsecond incremental time segment and the digital error may be plus or minus 0.1 microsecond. If the sine wave frequency of signals A and B are for example, ten hertz, then the phase error caused by the digital error of plus or minus 0.1 microsecond would be on the order of 0.1 $\times 10^{-6}/0.1$ or 0.0001 percent. Of course, one skilled in the art will recognize that the foregoing is an example only and that the frequencies for any given system will be selected to suit the needs of a particular measurement situation. It will also be recognized that the frequencies selected will be limited only by the capability of the circuits selected and the characteristics of the interconnections provided therefore.

Signal L is fed from $\bar{Q}$ output terminal 110 of J-K flip-flop 72 to RESET input terminal 146 of "D" flip-flop 144. RESET input terminal 146 has the capability of holding "D" flip-flop 144 in the OFF state, (high logic level at $\bar{Q}$ output terminal 160) as long as it is in a low logic level state. When RESET input terminal 146 goes to a high logic level, "D" flip-flop 144 is free to respond to inputs to DELAY input terminals 142 and CLOCK input terminal 148 as previously described for D flip-flop 134, above.

Three input NAND gate 150 is fed from $\overline{Q}$ output terminal 160 of "D" flip-flop 144, Q output terminal 158 of "D" flip-flop 134 and a signal from clock pulse generator CP. When all three of these signals are simultaneously in a high logic level state and only when this is true, NAND gate 150 output terminal 162 goes to a low logic level. Signal R (and R') is representative of the output of terminal 162 of NAND gate 150. The negative going pulses in signal R waveform are coincident with input pulses CP (not shown) during the time that the other two input signals at terminals 154, 156 are also in a high state.

Signal R is fed to Period Counter 166 UP control terminal 164 and Period Counter 166 responds by digitally counting the negative pulses applied thereto.

It may be seen from FIG. 2 that signal R applied to UP control terminal 164 of Period Counter 166 contains negative pulses during the time corresponding to the period of signal A. FIG. 3 illustrates the portion of signal R in the vicinity of the zero crossing time at R'. The count recorded by Period Counter 166 is composed of three elements:

1. The count made during the noisy portion of signal C just prior to the time of the solid positive portion of signal C. Since the positive portion of the noisy signal segment is nearly equal (in time) to the negative portion of the same noisy signal segment, because of the random nature of the noise, the pulses into counter 166 occur for almost exactly one-half of the total time during which the noisy signal segment exists. This means that the count in Period Counter 166 is nearly the same as though it had begun at the half-way point; i.e., the point corresponding in time to the true zero-crossing time of signal A and counted continuously to the time corresponding to the end of the noisy signal segment.

2. The count made during the time of the solid positive portion of signal C, the noisy transition time to the solidly negative portion of signal C and the solidly negative portion of signal C. Counter 166 counts continuously during this time.

3. The count made during the next noisy positive transition signal segment at the end of the measuring cycle. This count, as in (1) above, is also done at nearly a 50% count-no count duty cycle and hence produces a count equivalent to a continuous count for one-half the total noisy transition time.

It may be seen then, that because Period Counter 166 is reset to zero count by signal K from output terminal 108 of NAND gate 92 just prior to the beginning of the count cycle just described (as may be seen from a comparison of waveforms K and C of FIG. 2), the total count collected by Period Counter 166 is proportional to the time between two adjacent zero-crossing times of signal A.

Noisy sinusoidal signal B is representative of a signal of unknown phase relationship with respect to signal A. In fact, it may be of any phase relationship within the range of from zero to 360° with respect to signal A, the reference signal.

Signal B is applied to input terminal 26 of differential amplifiers 34, 36, 40. Since signal B differs from signal A only in phase and amplitude the frequency of the two signals being the same, it will be noted that it is operated on by the differential amplifiers 34, 36 and 40 in the same way as differential amplifiers 18, 20 and 24 operate upon signal A. The circuits of differential amplifiers 34, 36 and 40 are identical in all respects to differential amplifiers 18, 20, 24 except that bias voltage sources $-V_2$ and $+V_2$ may be adjusted to slightly different values from those of $-V_1$ and $+V_1$, respectively, for purposes of optimizing waveforms at output terminals 186 and 196 of differential amplifiers 36 and 40, respectively.

NAND gates 190 and 192 are connected to form DC flip-flop 194. The characteristics of DC flip-flop 194 are the same as those of DC flip-flop 62, previously described. Signals G and H are fed to input terminals 188 and 198 in the same manner as signals D and E were fed to DC flip-flop 62. Signal T from output terminal 200 of DC flip-flop 194 is similar to the waveform of Signal I from the output of DC flip-flop except that it is shifted in phase corresponding to the phase shift of signal B.

This Signal T from output terminal 200 of DC flip-flop 194 is fed to J-K flip-flop 204, CLOCK input terminal 202 and results in a signal at Q output terminal 212 which changes state at each negative transition of input terminal 202 as was previously explained in the opertion of J-K flip-flop 72. Signal K from output terminal 108 of NAND gate 92 is used to reset J-K flip-flop 204 at RESET input terminal 210. The short negative going pulse of Signal K causes J-K flip-flop 204 to go to the OFF state; i.e., Q output terminal 212 goes to a low logic level.

Note, however, that unlike J-K flip-flop 72 which may operate on the input signal at the CLOCK input terminal in any time phase, J-K flip-flop 204 is reset (on input terminal R) by signal K, FIG. 2. This assures that J-K flip-flop 204 will always respond to the first negative going transition of signal T after signal K by going from the low state (Q output terminal 212 low) to a high state (Q output terminal 212 high) as shown by signal O. As will be seen presently this is the circuit mechanism by which it is assured that the phase delay measurement of signal B always begins in the correct sequence with the period time measurement of signal A.

The signal from Q output terminal 212 is signal O. It is fed to "D" flip-flop 234, RESET input terminal 242 and holds D flip-flop 234 in the OFF state for as long as Signal O is at a low logic level. (Signal X is high).

However, D flip-flop 234 also utilizes a SET input terminal 232. When signal P on S input terminal 232 goes to a low state, "D" flip-flop 234 is locked in the ON state (Q output terinal 278 goes high).

Once signal O and signal P both go to a high logic level, D flip-flop 234 is free to respond to signal F input from output terminal 240 of differential amplifier 34 on DELAY input terminal 238 and to signal CP on CLOCK input terminal 236. As in "D" flip-flop 134 previously described, when signal F goes to a high logic level, D flip-flop 234 will transfer to the ON state (Q output terminal 278 goes high) at the time of the next occurring signal CP pulse.

It has been seen how signal O is generated on Q output terminal 212 of J-K flip-flop 204. Signal O and signal T from output terminal 200 of DC flip-flop 194 are fed to input terminals 214 and 218, respectively, of NAND gate 216. The signal generated at output terminal 220 of NAND gate 216 is signal S.

Signal S is fed to input terminal 222 of NAND gate 224 which is interconnected with NAND gate 226 to form DC flip-flop 228. Signal K from output terminal 108 of NAND gate 92 is fed to the other input terminal 230 of DC flip-flop 228. The resultant signal P is thus generated at output terminal 231 of DC flip-flop 228 and is fed to SET input terminal 232 of D flip-flop 234.

NAND gate 252 has three input terminals 254, 256 and 260, all of which must be at a high logic level in order to produce a low output level at terminal 264. The signal at input terminal 254 is CP, the system clock pulse. The signal at input terminal 256 is fed from Q output terminal 158 of "D" flip-flop 134 and the signal at input terminal 260 is fed from $\bar{Q}$ output terminal 262 of "D" flip-flop 234. Since output terminal 264 of NAND gate 252 is connected to UP input terminal 266 of Phase Delay Counter 268, when input terminals 256 and 260 are both high, Phase Delay Counter 268 is enabled to count CP pulses. It should be noted that Phase delay Counter 268 is reset by signal K on RESET input terminal 270 at the same time as Period Counter 166 is reset by the same signal on RESET terminal 183. Reference to FIG. 2 will show that this occurs less than one-half cycle before signal A makes a positive going zero crossing.

But note, also, that if signal B is already high with respect to the zero crossing base line, signal F is also high and "D" flip-flop 234 would be turned ON ($\bar{Q}$ output terminal 262 would be low) except that RESET input terminal 242 is held low at this time (from signal O) forcing D flip-flop 234 into the OFF state with $\bar{Q}$ output terminal 262 being held high. Thus, this input to terminal 260 is high simultaneous with the high signal to input terminal 256 and NAND gate 252 is enabled each time a CP pulse is present at input terminal 254, thus allowing Phase Delay Counter 268 to count the CP pulses.

There is one exception to the foregoing description of the beginning of Phase Delay Counter 268 count cycle. As long as the negative transition of signal G follows the negative transition of signal K, the Phase Delay Counter 268 will be enabled to count UP by the negative pulses on input terminal 266. But if the initial noisy positive transition signals of signal F (derived from signal B) lead those of signal C (derived from signal A) because of the inherently unstable time locations of signal D (from which reset signal K is derived) and signal G, it is still desirable that accurate measurements be accomplished. This instability in the relative positions of logic signals D and G can cause a measurement to be made when signal B actually leads signal A. The following mechanism provides the desired accurate measurements under this condition, as well as all other phase relation conditions, including the case where signals A and B are exactly in phase. When the true phase differential is zero between signals A and B, the circuit should present a net zero count to Phase Delay Counter 268. This is accomplished by enabling NAND gate 252 (providing an UP count) when signal C noise is above zero, enabling NAND gate 272 (providing a DN count) when signal F is above zero and disabling both NAND gates 252 and 272 when both signal C and signal F are above zero. $\bar{Q}$ input to NAND gate 272 input terminal 280 from "D" flip-flop 134 output terminal 178 assures that there will be no DN (down) count on Phase Delay Counter 268 when signal C is high and input to NAND gate 252 input terminal 260 from output terminal 262 of "D" flip-flop 234 assumes that there will be no UP count on Phase Delay Counter 268 when signal F is high. Therefore, if signal C is high it blocks a DN (down) count and if signal F is high it blocks an UP (up) count. It follows that if both signals are high, Phase Delay Counter 268 will count neither UP (up nor DN (down).

By way of example, suppose that the noise width of signal C and signal F were each 10 milliseconds and that the true zero crossing of signal F were delayed by 5 milliseconds from the true zero crossing of signal C. Phase Delay Counter 268 would count UP for one-half of the first five millliseconds of the noisy portion of signal C (making the reasonable assumption that the noise level of signal C is above zero for a time equal to the time for which it is below zero due to the random distribution characteristics of the noise.) The count for the first 5 milliseconds, then, will equal a count for a continuous counting time of 2½ milliseconds. During the next 5 milliseconds, both signal C and signal F will be varying above and below zero level in a random distribution due to the nature of the noise. During the time when only signal C is above zero, Phase Delay Counter 268 will count UP. During the time when only signal F is above zero, Phase Delay Counter 268 will cound DN. These counts will tend to cancel and equal zero because of the random distribution of both noise signals above and below zero. During the time when both signal C and signal F are above zero, Phase Delay Counter 268 will not count at all because of the inhibiting effect on the $\bar{Q}$ inputs to NAND gates 252 and 272.

During the next 5 milliseconds signal C will be high all of the time and signal F will be high for one-half of the time and low for one-half of the time. When both signals are high (one-half the time) Phase delay Counter 268 will not count. When signal C is high and signal F is low (the other one-half of the time, or for 2½ milliseconds), Phase Delay Counter 268 will count UP.

So it can be seen in this example, that the net count at the end of the noisy periods of signals C and F will be the same as though the counter had counted continuously for 5 milliseconds, the time by which signal F lags signal C. Therefore, at the end of the count, Phase Delay Counter 268 contains a count proportional to the time delay between the true zero crossings of signals A and B.

It will be understood by one skilled in the art that although the true zero crossing of signal B always follows that of A by definition, the presence of noise in the system will sometimes cause the first positive noise transition of signal F to lead that of signal C. This means that during the portion of the noisy transition of signal F that occurs before that of signal C, the system will cause a DN count for one-half the time. Then, when both signals are noisy, a net zero count will result, as explained above. And finally, when signal C is high, if signal F is still noisy, an UP count will occur for one-half the time. If the UP count time is shorter than the DN count time, Phase Delay Counter 268 will exhibit a small negative number at the end of the count. It will be understood that this small negative number may be interpreted as equivalent to a very long delay time; approaching 360°, and this is the desired result.

In the case where there is no overlap between the noisy parts of signal C and signal F, the first positive transition of signal C after signal K causes Phase Delay Counter 268 to begin its UP count as a result of Q output terminal 158 of "D" flip-flop 134 going high and $\bar{Q}$ output terminal 262 of "D" flip-flop 234 being held high by signal O on RESET input terminal 242, since when these two inputs to NAND gate 252 are high, CP pulses are allowed to pass through NAND gate 252 and feed UP input terminal 266 of Phase Delay Counter 268. The count proceeds on each high half cycle of the noise input from signal C. Since the noisy part of signal C is high for one-half of the time due to the random nature of the noise distribution, the counter counts UP for one-half of the noisy time of signal C. The counter continues the count UP when signal C goes high in the absence of noise, but the count rate is now only a function of CP since every CP pulse is counted. At a point less than halfway into the positive half-cycle of signal C, signal N goes low at SET input terminal 132 of "D" flip-flop 134 and holds Q output terminal 158 until the following signal K pulse just prior to the next count cycle. That is, signal C loses control of "D" flip-flop 134 for the balance of the instant count cycle and insofar as "D" flip-flop 134 has control of the UP count through input terminal 256 of NAND gate 252, the count continues regardless of signal C transitions.

"D" flip-flop 234 is at this time held in the OFF state with $\overline{Q}$ output terminal 262 high (signal X), due to signal O on RESET input terminal 242 being low. Signal O changes to a high state upon the first negative transition of signal G after the negative pulse of signal K. When signal O goes high, "D" flip-flop 234 is enabled to accept drive from signal F on DELAY input terminal 238. "D" flip-flop 234 stays in the OFF state then until the first positive transition of signal F after this change in signal O to a high state. When the noisy transition of signal F occurs, "D" flip-flop 234 follows the noise transitions both high and low and $\overline{Q}$ output terminal 262 varies correspondingly at clock pulse CP times (signal X). Signal X, applied to input terminal 260 of NAND gate 252 acts to alternately gate clock pulse CP through NAND gate 252 to the UP input terminal 266 of Phase Delay Counter 268. The counter responds by counting CP pulses at a 50% duty cycle rate during the noisy period of signal F.

When signal C goes to a constant high state at the end of this noisy period, "D" flip-flop 234 responds by going to the ON state ($\overline{Q}$ output terminal 262, signal X, goes low) and NAND gate 252 is inhibited from sending CP pulses to Phase Delay Counter 268 due to low signal X on input terminal 260 of NAND gate 252. The count in Phase Delay Counter 268 is now complete and consists of three elements:

1. A count at a 50% duty cycle of the noisy portion of the first positive transition of signal C after signal K reset. This corresponds to a full count for one-half the time or a full count from the true zero crossing time of signal A to the end of the noisy portion of signal C.

2. A full time count of the time from the end of the count in (1), above, until the beginning of the noisy portion of the first positive transition time of signal F after that time.

3. A count at a 50% duty cycle of the noisy portion of the positive transition of signal F which occurs at the end of the count of (2), above. This coresponds to a full time count for one-half the time and is equivalent to stopping a fulltime count at the true zero crossing time of signal F.

The total count in Phase Delay Counter 268 will then be proportional to the phase delay between signal A and signal B.

Read pulse, signal M is provided at output terminal 288. This signal goes high within one-half cycle of the end of Period Counter 166 count completion. Since Phase Delay Counter 268 count is always complete and holding at this time, signal M may be used as a signal, to connecting equipment, that Period Counter 166 and Phase Delay Counter 268 are ready for readout.

The digital counts thus stored in period counter 166 and phase delay counter 268 may then be utilized to determine the phase angle relationship of signal A and signal B:

$$\frac{\text{Phase delay count}}{\text{Period Count}} \times 360 = \phi$$

where $\phi$ is the phase angle between signal A and signal B in degrees.

This completes the description of the circuits and functions of the preferred embodiment of the invention.

Various modifications and changes may be made to the present invention from the principles of the invention described above without departing from the spirit and scope thereof, as encompassed in the accompanying claims.

What is claimed is:

1. An apparatus for providing an indication of a phase angle relationship of a first and a second noisy signal; the first and second signals having the same period, each signal having a spectrum consisting only of odd harmonics of a sine wave having the same period, and each signal having a finite slope at each zero crossing time; comprising:
   means for amplifying and limiting the first and second noisy signals to provide first and second bilevel signals, respectively, said bilevel signals being noisy in the time vicinity of the zero crossing times;
   means for providing clock pulses of a predetermined repetition rate;
   first and second counter means; and
   logic means for enabling said first counter means to count and store a first number of clock pulses proportional to the period time of said first noisy signal, for enabling said second counter means to count and store a second number of clock pulses proportional to the phase delay time between said first and said second noise signals and for providing an output signal indicative of the completion of said counts.

2. The apparatus according to claim 1 wherein said amplifier and limiter means comprises:
   first threshold control means for responding to a portion of the first noisy signal above a first reference level to produce a high level of a first bilevel signal and for responding to a portion of the first noisy signal below said first reference level to produce a low level of said first bilevel signal; and
   second threshold control means for responding to a portion of the second noisy signal above a second reference level to produce a high level of a second bilevel signal and for responding to a portion of the second noisy signal below said second reference signal to produce a low level of said second bilevel signal.

3. The apparatus according to claim 2 wherein said logic means comprises:

first means for enabling said first counter means to continually count in a first direction said clock pulses during a time period between any two alternate noisy portions of said first bilevel signal; and second means for enabling said first counter means to count in said first direction said clock pulses during said alternate noisy portions of said first bilevel signal, said count being limited in time to correspond to a time when said noisy portion exceeds a first predetermined signal level.

4. The apparatus according to claim 3 wherein said second bilevel signal has alternate first and second noisy portions corresponding to said first and second noisy portions of said first bilevel signals, said first noisy portion of said second bilevel signal being delayed in time from said first noisy portion of said first bilevel signal corresponding in time to the phase angle relationship of the first and second noisy signals, wherein said logic means comprises:

third means for enabling said second counter means to count said clock pulses in said first direction when said first noisy portion of said first bilevel signal is above a first predetermined signal level and when the initial time of said first noisy portion of said second bilevel signal does not precede the initial time of said first noisy portion of said first bilevel signal;

fourth means for enabling said second counter means to continually count said clock pulses in said first direction between the time of said first noisy portion of said first bilevel signal and said first noisy portion of said second bilevel signal when said first noisy portion of said first bilevel signal and said first noisy portion of said second bilevel signal do not overlap in time;

fifth means for enabling said second counter means to count said clock pulses in said first direction when said first noisy portion of said second bilevel signal is above a second predetermined signal level and when the times of said first noisy portions of said first and second bilevel signals do not overlap;

sixth means for enabling said second counter means to count said clock pulses in said first direction when said first noisy portion of said first bilevel signal is above said first predetermined signal level and said first noisy portion of said second bilevel signal is below said second predetermined signal level and said first noisy portions of said first and said second bilevel signals overlap in time; and seventh means for enabling said second counter means to count said clock pulses in a second direction when said first noisy portion of said second bilevel signal is above said second predetermined signal level and said first bilevel signal is below said first predetermined signal and when the initial time of said first noisy portion of said second bilevel signal precedes the initial time of said first noisy portion of said first bilevel signal.

5. A method for indicating a phase angle relationship of a first and a second noisy signal, the first and second noisy signals having the same period, each signal having a spectrum consisting of only odd harmonics of a sine wave having the same period and each signal having a finite slope at each zero crossing time; comprising the steps of:

amplifying and limiting the first and second noisy signals to provide first and second bilevel signals, respectively, said bilevel signals being noisy in the time vicinity of the zero crossing times;

generating clock pulses of a predetermined repetition rate;

enabling a first counter to count said clock pulses for a time corresponding to the period of said first noisy signal;

enabling a second counter to count said clock pulses for a time corresponding to the phase delay between the first and second noisy signals; and providing an output signal indicative of a completion of said first and second counter counts.

6. The method according to claim 5 wherein said step of amplifying and limiting comprises the steps of:

detecting a positive threshold level of said noisy signals to provide a high bilevel signal output; and detecting a negative threshold level of said noisy signals to provide a low bilevel signal output.

7. The method according to claim 6 wherein said first and second bilevel signals have alternate first and second noisy portions, said first and second alternate noisy portions of said second bilevel signal being delayed in time from corresponding said first and second noisy portions of said first bilevel signal by a time corresponding to the phase angle relationship between the first and second noisy signals, comprising the steps of:

counting of said clock pulses in said first counter in a first direction during said first and second alternate noisy portions of said first bilevel signal when said alternate noisy portions exceed a first predetermined signal level;

counting of said clock pulses continually between said alternate noisy portions of said first bilevel signal in said first counter in said first direction, said counts being cumulative with said counts resulting from said noisy portions of said first bilevel signal to provide a total count proportional to the period of the first noisy signal;

counting of said clock pulses in said second counter in said first direction when said noisy portion of said first bilevel signal exceeds said first predetermined signal level and when the initial time of said first noisy portion of said second bilevel signal does not precede the initial time of said first noisy portion of said first bilevel signal in time;

counting of said clock pulses in said second counter in said first direction between said time of said first noisy portion of said first bilevel signal and said time of said first noisy portion of said second bilevel signal;

enabling counting of said clock pulses in said second counter in said first direction when said first noisy portion of said second bilevel signal exceeds a second predetermined level and the initial time of said first noisy portion of said second bilevel signal does not precede the initial time of said first noisy portion of said first noisy signal;

counting of said clock pulses in said second counter in said first direction during the time when said first noisy portion of said first bilevel signal exceeds said first predetermined signal level and said second bilevel signal is below said second predetermined signal level when said first noisy portions of said first and second bilevel signals overlap in time; and counting of said clock pulses in said second counter in said second direction during the time when said first noisy portion of said second bilevel signal exceeds said second predetermined signal level and said first bilevel signal is below said first predetermined signal level when the initial time of said first noisy portion of said second bilevel signal precedes the initial time of said first noisy portion of said first noisy signal.

* * * * *